United States Patent
Yamagata et al.

(10) Patent No.: US 7,880,794 B2
(45) Date of Patent: Feb. 1, 2011

(54) IMAGING DEVICE INCLUDING A PLURALITY OF LENS ELEMENTS AND A IMAGING SENSOR

(75) Inventors: Michihiro Yamagata, Osaka (JP); Hiroaki Okayama, Osaka (JP); Kazutake Boku, Osaka (JP); Yasuhiro Tanaka, Hyogo (JP); Kenichi Hayashi, Nara (JP); Yoshimasa Fushimi, Osaka (JP); Shigeki Murata, Nara (JP); Takayuki Hayashi, Kyoto (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 11/886,970

(22) PCT Filed: Mar. 20, 2006

(86) PCT No.: PCT/JP2006/305511
§ 371 (c)(1),
(2), (4) Date: Sep. 24, 2007

(87) PCT Pub. No.: WO2006/101064
PCT Pub. Date: Sep. 28, 2006

(65) Prior Publication Data
US 2009/0122175 A1  May 14, 2009

(30) Foreign Application Priority Data
Mar. 24, 2005  (JP) .............................. 2005-086347

(51) Int. Cl.
*G02B 13/16* (2006.01)
(52) U.S. Cl. .................... 348/335; 348/336; 348/340
(58) Field of Classification Search .................. 348/335, 348/336, 340
See application file for complete search history.

(56) References Cited

U.S. PATENT DOCUMENTS 5,377,287 A * 12/1994 Lee et al. ...................... 385/35

(Continued)

FOREIGN PATENT DOCUMENTS

EP  1 079 613 A2  8/2000

(Continued)

OTHER PUBLICATIONS

Chinese Office Action issued in Chinese Patent Application No. CN200680009121.6 dated on Aug. 8, 2008.

*Primary Examiner*—Jason Chan
*Assistant Examiner*—Usman Khan
(74) *Attorney, Agent, or Firm*—McDermott Will & Emery LLP

(57) ABSTRACT

An object of the present invention is to provide: a thin imaging device in which a high image resolution is obtained and in which the resolution does not uniformly vary even when the shooting distance is changed; and a lens array used therein. The present invention relates to an imaging device comprising: a lens array 130 constructed by arranging in parallel a plurality of lens elements having optical power in at least one surface; and an image sensor 110 in which an optical image formed by an optical system having each of the lens elements is received by each of mutually different imaging regions each having a plurality of photoelectric conversion sections so that the optical image is converted into an electric image signal, wherein each lens element and the imaging region corresponding to the lens element constitute an imaging unit, while the imaging units have diverse imaging region areas. The present invention relates also to a lens array used therein.

11 Claims, 16 Drawing Sheets

U.S. PATENT DOCUMENTS

| | | | | |
|---|---|---|---|---|
| 5,712,731 A | * | 1/1998 | Drinkwater et al. | 359/619 |
| 6,062,695 A | * | 5/2000 | Kakuda et al. | 353/38 |
| 6,137,535 A | | 10/2000 | Meyers | |
| 7,009,652 B1 | | 3/2006 | Tanida et al. | |
| 7,292,264 B2 | * | 11/2007 | Itokawa | 348/143 |
| 7,620,309 B2 | * | 11/2009 | Georgiev | 396/113 |
| 7,656,428 B2 | * | 2/2010 | Trutna, Jr. | 348/208.1 |
| 7,732,744 B2 | * | 6/2010 | Utagawa | 250/208.1 |
| 2004/0201824 A1 | * | 10/2004 | Wada et al. | 353/69 |
| 2005/0225978 A1 | * | 10/2005 | Simaoka et al. | 362/235 |

FOREIGN PATENT DOCUMENTS

| | | | |
|---|---|---|---|
| EP | 1079613 A2 | * | 2/2001 |
| JP | 10-145802 | | 5/1998 |
| JP | 2001-061109 | | 3/2001 |
| JP | 2002-171447 | | 6/2002 |
| JP | 2002171447 A | * | 6/2002 |

* cited by examiner (a)

(b)

(a)

(b)

(a)

(b)

PRIOR ART

PRIOR ART

IMAGING DEVICE INCLUDING A PLURALITY OF LENS ELEMENTS AND A IMAGING SENSOR

RELATED APPLICATIONS

This application is the U.S. National Phase under 35 U.S.C. §371 of International Application No. PCT/JP2006/305511, filed on Mar. 20, 2006, which in turn claims the benefit of Japanese Application No. 2005-086347, filed on Mar. 24, 2005, the disclosures of which Applications are incorporated by reference herein.

TECHNICAL FIELD

The present invention relates to an imaging device. More specifically, the present invention relates to a compound eye type imaging device that includes: a lens array composed of a plurality of lens elements; and an image sensor having imaging regions divided for each lens element. Further, the present invention relates to a lens array used suitably in the imaging device.

BACKGROUND ART

In the digital still camera market which is growing in recent years, needs for small thin cameras having improved portability are increasing. In the circuit elements that perform signal processing, function improvement and size reduction are progressing, for example, by adoption of finer circuit patterns. Further, in the recording media, those having a small size and a large capacity can be obtained at low prices. Nevertheless, in the imaging devices constructed from an imaging optical system and an image sensor such as a CCD (Charge Coupled Device) sensor or a MOS (Metal Oxide Semiconductor) sensor, size reduction, especially thickness reduction, is not yet achieved satisfactorily. Thus, also for the purpose of realizing cameras having improved portability, development of thin imaging devices is desired.

As a configuration for realizing thickness reduction in an imaging device, a compound eye type imaging device is known in which a plurality of minute lens elements are arranged in a plane. A conventional optical system in which a plurality of lens elements are arranged on the optical axis has problems that the length increases in the optical axis direction and hence the volume increases, and that the lens diameter is large and hence the aberration increases. In contrast, in the compound eye type imaging device, the thickness is reduced in the optical axis direction. Further, since the lens diameter of each minute lens element is small, the aberration can be suppressed to be comparatively small.

For example, Japanese Laid-Open Patent Publication No. 2001-61109 discloses an imaging device that forms an image by means of a plurality of minute image formation optical systems. This imaging device includes: a photoelectric conversion section of a single plane; and an imaging unit array in which a plurality of imaging units are arranged. Then, for individual imaging units, the imaging unit array focuses the light beam from a photographic object at different positions on the photoelectric conversion section.

[Patent Document 1] Japanese Laid-Open Patent Publication No. 2001-61109

DISCLOSURE OF THE INVENTION

Problems to be Solved by the Invention

FIG. 14 is a part-removed perspective view showing an example of a configuration of a conventional imaging device. Further, FIG. 15 is a schematic diagram showing a lens array of the conventional imaging device. FIG. 15(*a*) is a plan view of the lens array, while FIG. 15(*b*) is a side view of the lens array. In FIG. 14, the imaging device 900 includes an image sensor 910, a partition member 920 and a lens array 930.

The image sensor 910 has a light acceptance surface composed of a large number of photoelectric conversion sections each corresponding to a pixel. The image sensor 910 converts incident light that is incident on the light acceptance surface, into an electric signal in accordance with the intensity, and then outputs the signal as an electric image signal to the outside. The light acceptance surface of the image sensor 910 includes square imaging regions 910*a* each composed of a plurality of photoelectric conversion sections.

The partition member 920 has a grid-shaped partition section 920*a* formed such as to surround each imaging region 910*a* in correspondence to the square imaging region 910*a*. The lens array 930 is composed of a large number of lens elements 930*a* that are arranged in parallel and formed integrally in plane. Each lens element 930*a* is formed in correspondence to each imaging region 910*a* of the image sensor 910. Here, a lens element 930*a* and the corresponding imaging region 910*a* constitute an imaging unit. Individual imaging units are physically separated from each other by the partition member 920.

In FIG. 15, the lens elements 930*a* contained in the lens array 930 are planer-convex lens elements having an axial symmetric curved surface (typically, a spherical surface) with the convex surface facing the photographic object side. Each lens element 930*a* is arranged in such a manner that the center of each imaging region 910*a* agrees with the symmetry axis.

In the above-mentioned configuration, each lens element 930*a* forms an optical image of a photographic object in the corresponding imaging region 910*a*. Each imaging region 910*a* converts the formed optical image into an electric image signal and then outputs the signal. The image signal outputted from each imaging unit is combined by an image processing device (not shown) and thereby reconstructed into an image signal of a composite image corresponding to a single image. At that time, in the image signals outputted from the imaging units, optical images of the photographic object is formed from diverse viewpoints depending on the individual imaging units. This improves the resolution of the composite image.

FIG. 16 is an optical path diagram describing the operation of a conventional imaging device. The optical path diagram of FIG. 16 schematically shows imaging units arranged when the imaging device 900 is cut in a plane that contains a diagonal line A-A' of the lens array 930 and that is perpendicular to the image sensor. In FIG. 16, description of the partition member 920 is omitted.

In FIG. 16, n imaging units U1 to Un are constructed from respectively corresponding lens elements L1 to Ln and imaging regions D1 to Dn. In the imaging device 900, all the imaging units U1 to Un have the same configuration. That is, the lens elements L1 to Ln have the same effective diameter and the same focal length, while the imaging regions D1 to Dn have the same area and the same number of pixels.

The imaging unit U1 acquires the image of the part of a photographic object region A1. That is, in the imaging unit U1, the lens element L1 forms in the imaging region D1 an optical image of the photographic object region A1. Similarly, the imaging unit U2 acquires the image of the part of a photographic object region A2, while the imaging unit Un acquires the image of the part of a photographic object region An. As a result, the imaging device 900 can acquire the image of the majority of the part Aall extending from the photographic object region A1 to the photographic object region An, with overlapping with each other. In each overlapping part of the photographic object regions, optical images of the photographic object are formed respectively in different lines of sight. Thus, when image processing is performed, the resolution of the composite image is improved.

Nevertheless, as seen from FIG. 16, the periphery part Aa1 of the photographic object region A1 does not have an overlapping part with the photographic object region A2 of the adjacent imaging unit U2, while the periphery part Aan of the photographic object region An does not have an overlapping part with the photographic object region An-1 of the adjacent imaging unit Un-1. Thus, in the optical image of the photographic object located in the periphery part Aa1 and the periphery part Aan, resolution has not been improved when a composite image is reconstructed.

Further, in the imaging device 900, all the imaging units U1 to Un had have the same configuration. Thus, the resolution of the composite image has been determined uniquely depending on the shooting distance. This has caused a problem that the resolution varies uniformly when the shooting distance is changed to a large extent.

An object of the present invention is to provide a thin imaging device in which a high image resolution is obtained and in which the resolution does not uniformly vary even when the shooting distance is changed. Another object of the present invention is to provide a lens array suitable for this imaging device.

Solution to the Problems

One of the above-mentioned objects is achieved by the following imaging device. That is, the present invention relates to an imaging device comprising:

a lens array constructed by arranging in parallel a plurality of lens elements having optical power in at least one surface; and an image sensor in which an optical image formed by an optical system having each of the lens elements is received by each of mutually different imaging regions each having a plurality of photoelectric conversion sections so that the optical image is converted into an electric image signal, wherein each lens element and the imaging region corresponding to the lens element constitute an imaging unit, while the imaging units have diverse imaging region areas.

Further, one of the above-mentioned objects is achieved by a lens array used in the imaging device.

EFFECT OF THE INVENTION

According to the present invention, a thin imaging device is provided in which a high image resolution is obtained and in which the resolution does not uniformly vary even when the shooting distance is changed. Further, according to the present invention, a lens array is provided that is suitable for this imaging device.

Figure 1:
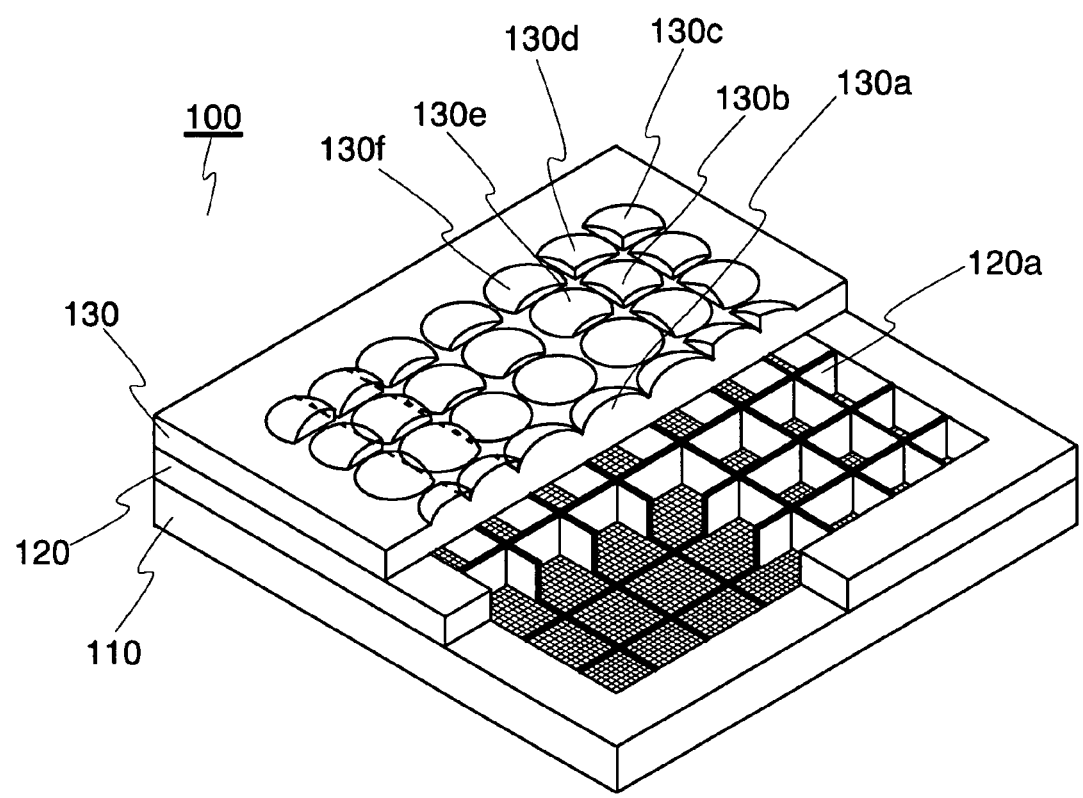
FIG. 1 is a part-removed perspective view showing a configuration of an imaging device according to Embodiment 1.

DESCRIPTION OF THE REFERENCE CHARACTERS 110, 210, 610 Image sensor
120, 220, 620 Partition member
130, 230, 330, 430, 530, 630 Lens array

BEST MODE FOR CARRYING OUT THE INVENTION

Embodiment 1

Figure 2:
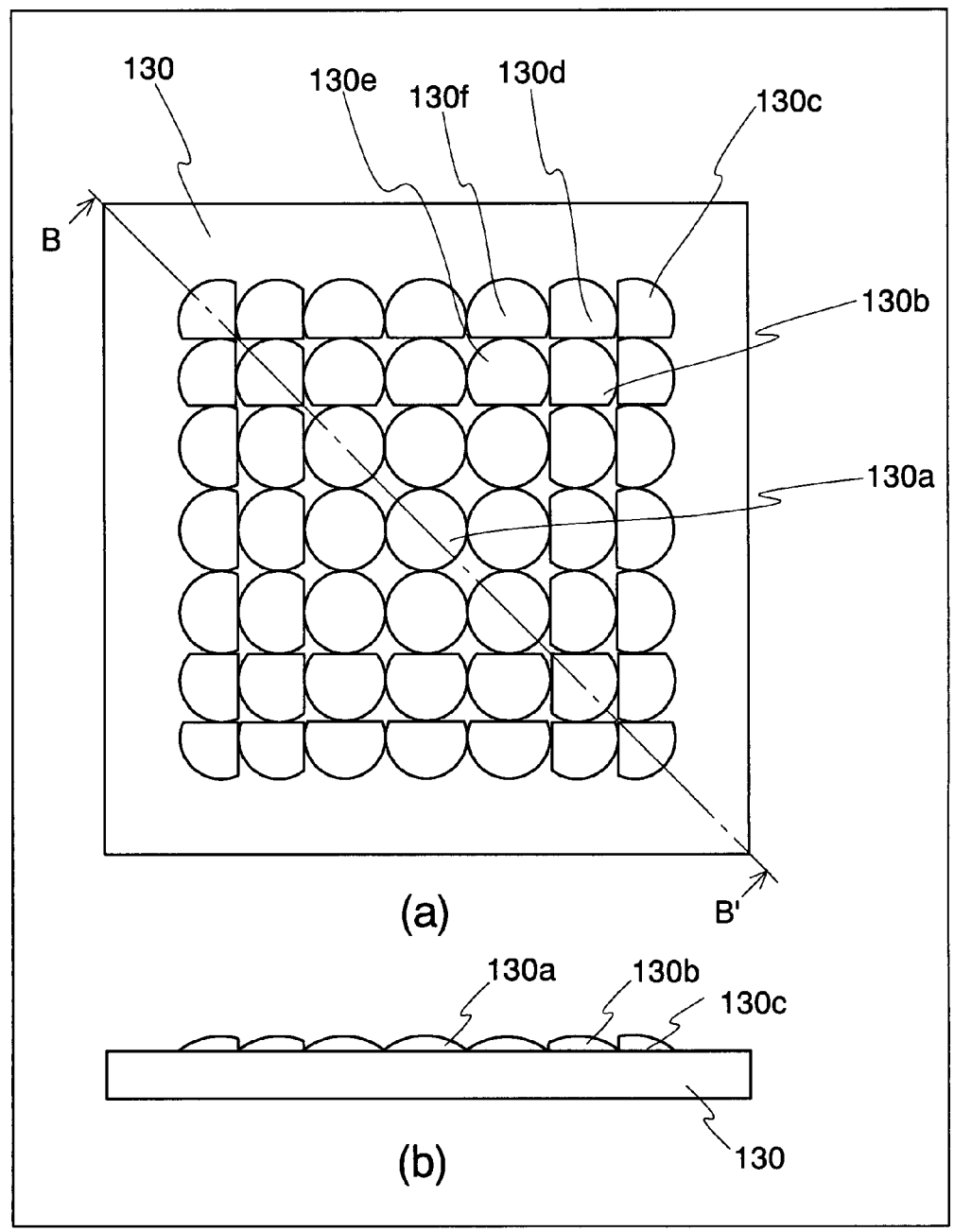
FIG. 2 is a schematic diagram showing a lens array of an imaging device according to Embodiment 1.

FIG. 1 is a part-removed perspective view showing a configuration of an imaging device according to Embodiment 1. Further, FIG. 2 is a schematic diagram showing a lens array of the imaging device according to Embodiment 1. FIG. 2(*a*) is a plan view of the lens array, while FIG. 2(*b*) is a side view of the lens array. In FIG. 1, the imaging device 100 includes an image sensor 110, a partition member 120 and a lens array 130.

The image sensor 110 has a light acceptance surface composed of a large number of photoelectric conversion sections each corresponding to a pixel. The image sensor 110 converts incident light that is incident on the light acceptance surface, into an electric signal in accordance with the intensity, and then outputs the signal as an electric image signal to the outside. The light acceptance surface of the image sensor 110 includes rectangular imaging regions 110*a* to 110*f* (numerals are not indicated in FIG. 1) and the like each composed of a plurality of photoelectric conversion sections.

The partition member 120 has a grid-shaped partition section 120a formed such as to surround each imaging region in correspondence to the rectangular imaging region. The lens array 130 is composed of a large number of lens elements 130a to 130f and the like that are arranged in parallel and formed integrally in plane. Each lens element 130a to 130f is formed in correspondence to each imaging region 110a to 110f of the image sensor 110. Here, each lens element 130a to 130f and the corresponding imaging region 110a to 110f constitute an imaging unit. Individual imaging units are physically separated from each other by the partition member 120. That is, the partition member 120 has functions that reflection of stray light incident on the partition section 120a is suppressed and that incident light emitted from the lens elements other than the corresponding lens element is prevented from reaching other imaging regions.

The imaging device 100 is constructed such that the areas of the imaging regions of imaging units located in the periphery part distant from the center part of the image sensor should be smaller than the areas of the imaging regions of imaging units located in the center part of the image sensor. Specifically, as for the imaging units arranged on the diagonal line of the image sensor, the square imaging region of the imaging unit located in the most peripheral part is smaller than the square imaging region of the imaging unit located at a position deviated from the most peripheral part to the center side by one row. The square imaging region of the imaging unit located at a position deviated from the most peripheral part to the center side by one row is smaller than the square imaging region of the imaging unit located in the center part. The other imaging units located in the most peripheral part have imaging regions of a rectangle that has a side length equal to the side length (the length of one side of the square) of the imaging region of the imaging unit located at a corner of the most peripheral part. The other imaging units located at positions deviated from the most peripheral part to the center side by one row are similar. Here, in the present specification, the center part indicates a position that contains or is in contact with the center axis of the image sensor.

In FIG. 2, each of the lens elements 130a to 130f and the like contained in the lens array 130 is a refractive type lens element that has an axial symmetric curved surface (typically, a spherical surface) convex to the photographic object side and that has overall positive optical power.

The lens element 130a located in the center part is a planer-convex axial symmetric lens element provided with an axial symmetric lens face having the shape of a circle approximately inscribing the corresponding square imaging region. The lens element 130b located at a corner at a position deviated from the most peripheral part to the center side by one row and the lens element 130c located at a corner of the most peripheral part have respectively a shape obtained by cutting off a part of an axial symmetric lens element similar to the lens element 130a in two planes parallel to the symmetry axis in accordance with the corresponding imaging region. As a result, the lens element 130b and the lens element 130c are lens elements each provided with a symmetry axis decentered in parallel to the axis passing through the center of the corresponding imaging region.

The lens element 130e located at a position deviated from the most peripheral part to the center side by one row and the lens element 130f located in the most peripheral part have respectively a shape obtained by cutting off a part of an axial symmetric lens element similar to the lens element 130a in a plane parallel to the symmetry axis in accordance with the corresponding imaging region. Further, the lens element 130d located in the most peripheral part has a shape obtained by cutting off a part of an axial symmetric lens element similar to the lens element 130a in two planes parallel to the symmetry axis in accordance with the corresponding imaging region. As a result, the lens element 130d, the lens element 130e and the lens element 130f are lens elements each provided with a symmetry axis decentered in parallel to the axis passing through the center of the corresponding imaging region.

It is preferable that the lens array 130 is produced from a resin that allows the light beam to transmit and form an optical image of the photographic object. For example, when an optical image in the visible light region is to be formed, optical resins such as cycloolefin resins, polycarbonate and acrylic resins, which transmit visible light, are preferable. Further, in the lens array 130, since the lens elements need be aligned to each other with precision, integrated formation is preferable. When injection molding is performed using an optical resin described above, the lens array can be formed in an integrated manner. Alternatively, the lens array 130 may be produced by press molding of an optical glass material in an integrated manner.

In the above-mentioned configuration, each lens element forms an optical image of a photographic object in the corresponding imaging region. Each imaging region converts the formed optical image into an electric image signal and then outputs the signal. The image signal outputted from each imaging unit is combined by an image processing device (not shown) and thereby reconstructed into an image signal of a composite image corresponding to a single image. At that time, in the image signals outputted from the imaging units, optical images of the photographic object is formed from diverse viewpoints depending on the individual imaging units. This improves the resolution of the composite image.

Figure 3:
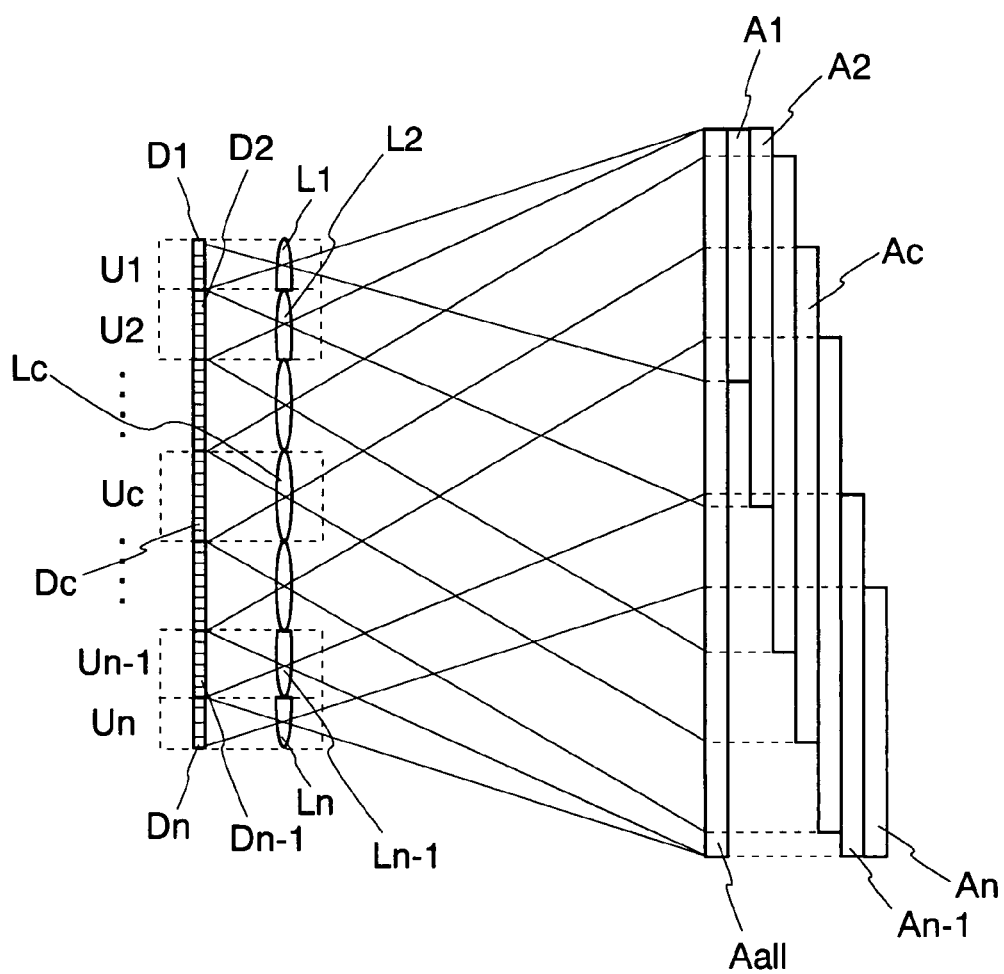
FIG. 3 is an optical path diagram describing operation of an imaging device according to Embodiment 1.

FIG. 3 is an optical path diagram describing the operation of an imaging device according to Embodiment 1. The optical path diagram of FIG. 3 schematically shows imaging units arranged when the imaging device 100 is cut in a plane that contains a diagonal line B-B' of the lens array 130 and that is perpendicular to the image sensor. In FIG. 3, description of the partition member 120 is omitted.

In FIG. 3, n imaging units U1 to Un are constructed from respectively corresponding lens elements L1 to Ln and imaging regions D1 to Dn. Here, the imaging unit Uc in the center part is constructed from a lens element Lc and an imaging region Dc. In the imaging device 100, the imaging regions D2 and Dn-1 of the imaging units U2 and Un-1 located at positions deviated from the most peripheral part to the center side by one row are smaller than the imaging region Dc of the imaging unit Uc located in the center part, and hence have a smaller number of pixels. Further, the imaging regions D1 and Dn of the imaging units U1 and Un located in the most peripheral part are smaller than the imaging regions D2 and Dn-1, and hence have a smaller number of pixels.

The imaging unit U1 acquires the image of the part of a photographic object region A1. That is, in the imaging unit U1, the lens element L1 forms in the imaging region D1 an optical image of the photographic object region A1. Similarly, the imaging unit U2 acquires the image of the part of a photographic object region A2, while the imaging unit Uc acquires the image of the part of a photographic object region Ac, while the imaging unit Un-1 acquires the image of the part of a photographic object region An-1, and while the imaging unit Un acquires the image of the part of a photographic object region An. At that time, the photographic object region A1 of the imaging unit U1 completely overlaps with the photographic object region A2 of the adjacent imaging unit U2, while the photographic object region An of the imaging unit Un completely overlaps with the photographic object region An-1 of the adjacent imaging unit Un-1. Thus, in the imaging device 100, the image signals outputted from the imaging unit U1 and the imaging unit Un can entirely be used for improving the resolution when a composite image is reconstructed.

Further, the imaging unit U1 and the imaging unit Un as well as the imaging unit U2 and the imaging unit Un-1 respectively output image signals of the photographic object with resolutions different from that of the imaging unit Uc in the center part. Thus, even when the shooting distance is changed, the resolution of the composite image is not determined uniquely. Accordingly, even when the shooting distance is changed to a large extent, the change in the resolution is alleviated.

As described above, since the imaging device 100 includes imaging units having diverse imaging region areas, even when the shooting distance is changed, the resolution does not uniformly vary. Further, in the imaging device 100, the areas of the imaging regions of imaging units located in the most peripheral part are smaller than the areas of the imaging regions of imaging units located in the center part. Thus, the area of each overlapping part of the optical images of the photographic object can be increased, so that the resolution of the output composite image can be improved.

Further, in the imaging device 100, the imaging units have a lens element having a shape obtained by cutting off a part of an axial symmetric lens element in a plane parallel to the symmetry axis. This increases the area that contributes to the image formation on the lens array.

Further, in the imaging device 100, the imaging units located in the most peripheral part of the image sensor have a lens element provided with a symmetry axis decentered in parallel to the axis passing through the center of the corresponding imaging region. This permits construction of a bright lens array having a large effective diameter.

Here, the imaging device 100 has been described for an exemplary case that the imaging regions of the two rows of imaging units consisting of the imaging units located in the most peripheral part and the imaging units located at positions deviated from the most peripheral part to the center side by one row are smaller than the imaging regions of imaging units located in the center part. However, the present invention is not limited to this. The areas of the imaging regions may be reduced sequentially in order from the center part to the most peripheral part. Further, the number of lens elements of the imaging device 100 is arbitrary. Thus, obviously, the image sensor in the center part may be divided into a desired number of imaging regions, and then the lens elements may be arranged in correspondence to each imaging region.

Figure 16:
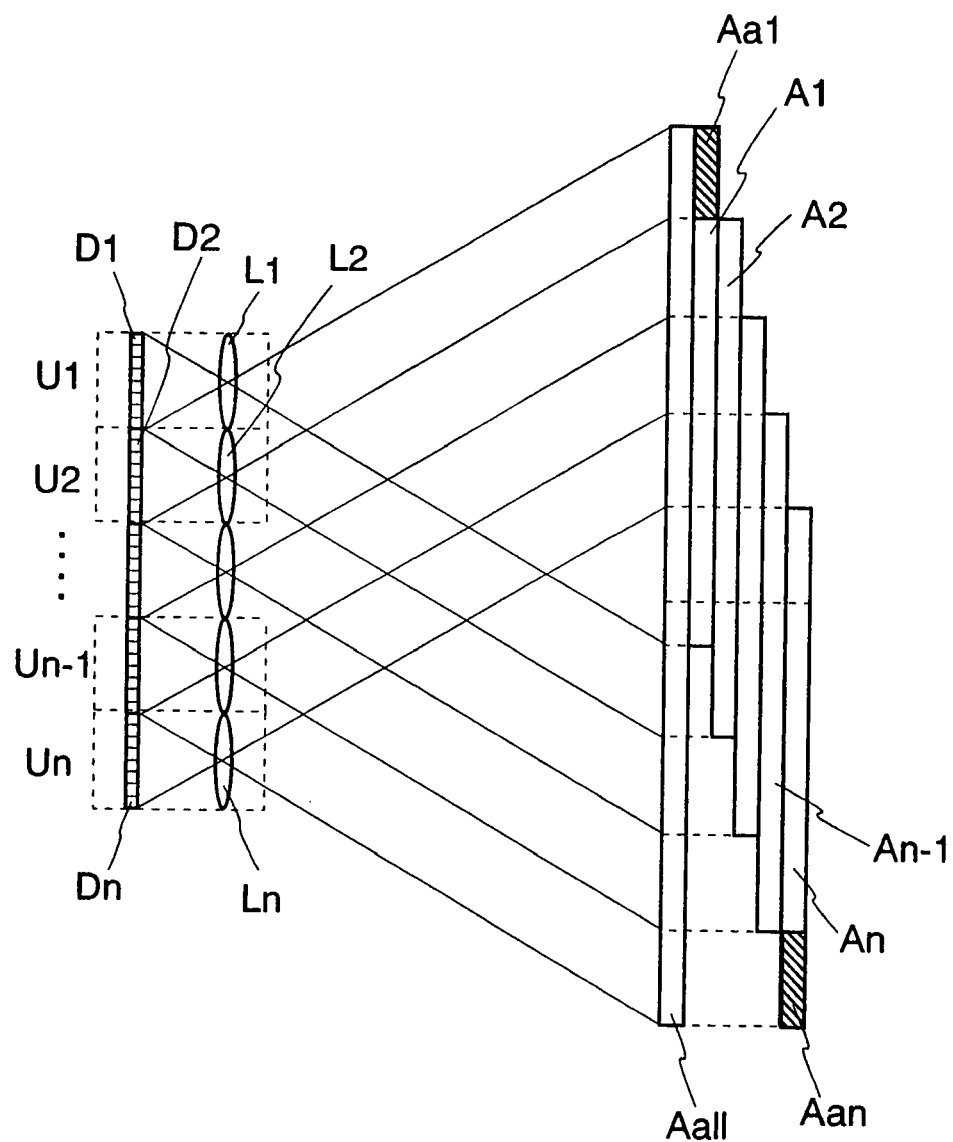
FIG. 16 is an optical path diagram describing operation of a conventional imaging device.

Further, the imaging device 100 has been described for an exemplary case that the photographic object region of each imaging unit located in the most peripheral part completely overlaps with the photographic object region of the adjacent imaging unit. However, the present invention is not limited to this. As described above, for example, the areas of the imaging regions of imaging units located in the most peripheral part are smaller than the areas of the imaging regions of imaging units located in the center part. Thus, in the imaging device according to the present Embodiment 1, the areas of the imaging regions of the imaging units are different from each other. Accordingly, even when the photographic object regions of adjacent imaging units do not completely overlap with each other, a region can sufficiently be reduced that has no overlapping part relative to the photographic object region of the adjacent imaging unit like the periphery part Aa1 of the photographic object region A1 and the periphery part Aan of the photographic object region An in the conventional imaging device shown in FIG. 16. That is, in the imaging device according to the present Embodiment 1, even when the photographic object regions of adjacent imaging units do not completely overlap with each other, the overlapping part of the photographic object regions can sufficiently be large in comparison with the conventional imaging device.

Here, also in the imaging device according to Embodiments 2 to 6 and other embodiments described later, similarly to the imaging device according to Embodiment 1, the areas of the imaging regions of the imaging units are different from each other. Thus, even when the photographic object regions of adjacent imaging units do not completely overlap with each other, the overlapping part of the photographic object regions can sufficiently be large in comparison with the conventional imaging device.

Embodiment 2

Figure 4:
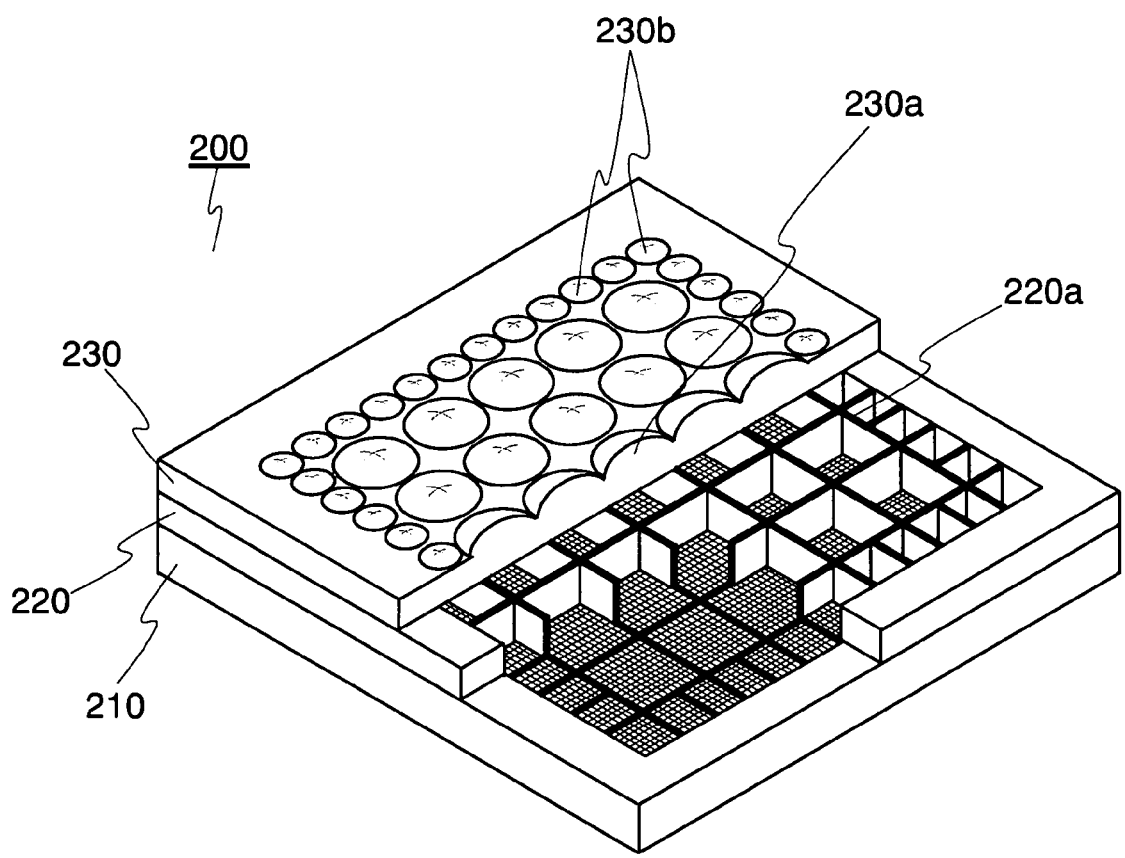
FIG. 4 is a part-removed perspective view showing a configuration of an imaging device according to Embodiment 2.
Figure 5:
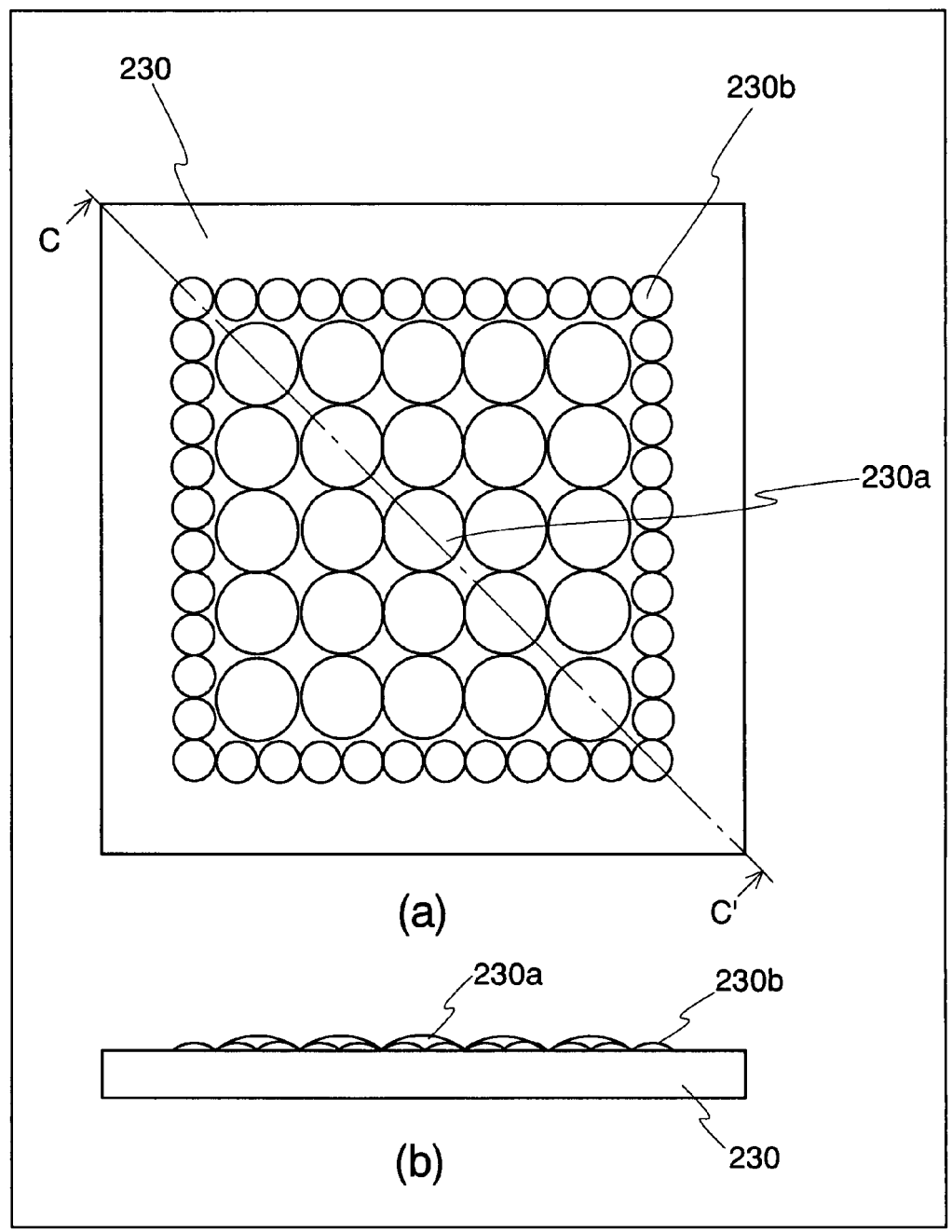
FIG. 5 is a schematic diagram showing a lens array of an imaging device according to Embodiment 2.

FIG. 4 is a part-removed perspective view showing a configuration of an imaging device according to Embodiment 2. Further, FIG. 5 is a schematic diagram showing a lens array of an imaging device according to Embodiment 2. FIG. 5($a$) is a plan view of the lens array, while FIG. 5($b$) is a side view of the lens array. The imaging device 200 according to Embodiment 2 has the same basic configuration as the imaging device 100 according to Embodiment 1. Thus, hereinafter, parts having a new feature depending on a difference point are solely described. In FIG. 4, the imaging device 200 includes an image sensor 210, a partition member 220 and a lens array 230.

A feature of the imaging device 200 is that all imaging units have a lens element provided with an optical axis in agreement with the axis passing through the center of the corresponding imaging region and have an axial symmetric lens face having the shape of a circle approximately inscribing the imaging region. That is, in comparison with the imaging device 100, a difference in the configuration of the imaging device 200 is that lens elements 230$b$ constituting imaging units located in the most peripheral part have a numerical aperture differ from that of lens elements 230$a$ constituting imaging units located in the center part. Here, each of the lens elements 230$a$ and 230$b$ contained in the lens array 230 is a refractive type lens element that has an axial symmetric curved surface (typically, a spherical surface) convex to the photographic object side and that has overall positive optical power.

Figure 6:
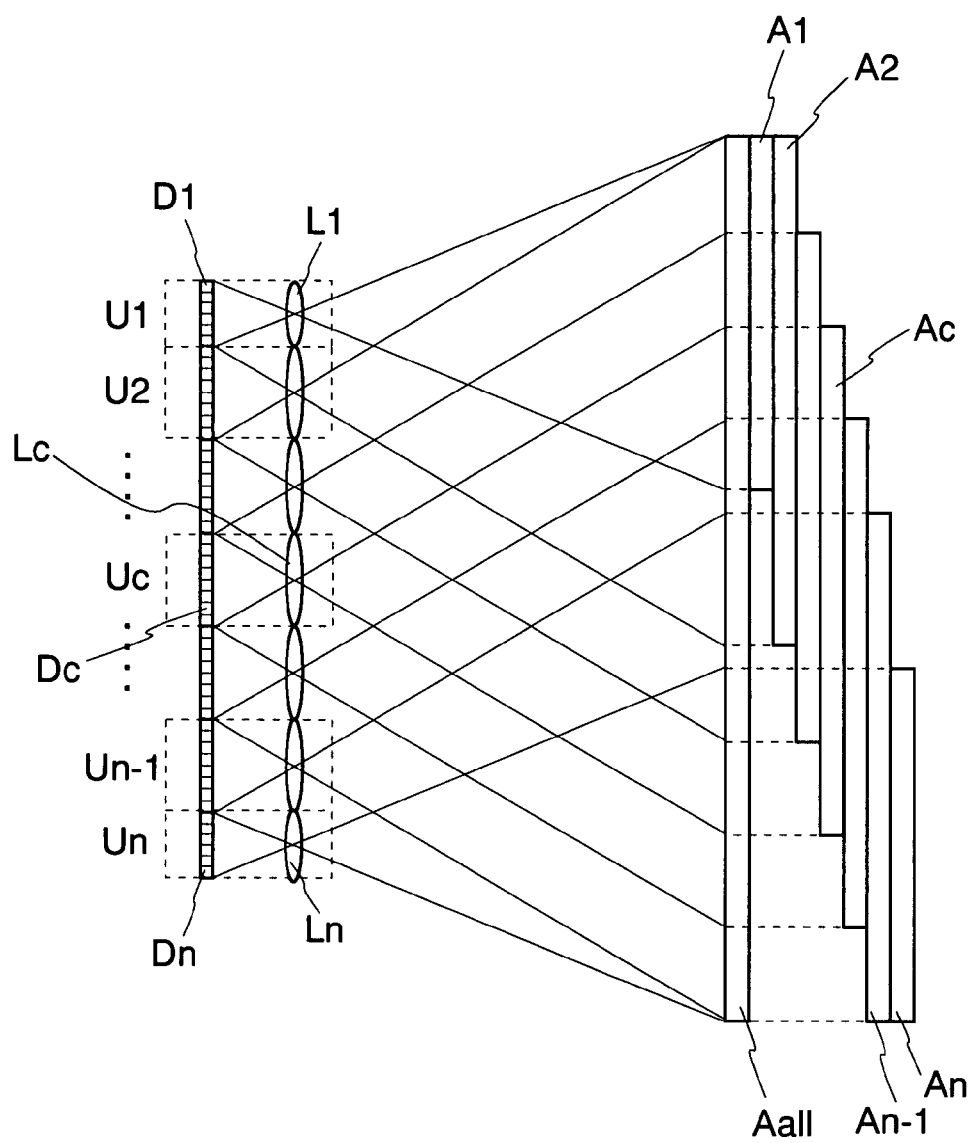
FIG. 6 is an optical path diagram describing operation of an imaging device according to Embodiment 2.

FIG. 6 is an optical path diagram describing the operation of an imaging device according to Embodiment 2. The optical path diagram of FIG. 6 schematically shows imaging units arranged when the imaging device 200 is cut in a plane that contains a diagonal line C-C' of the lens array 230 and that is perpendicular to the image sensor. In FIG. 6, description of the partition member 220 is omitted.

In FIG. 6, n imaging units U1 to Un are constructed from respectively corresponding lens elements L1 to Ln and imaging regions D1 to Dn. Here, the imaging unit Uc in the center part is constructed from a lens element Lc and an imaging region Dc. In the imaging device 200, the imaging region D1 and the imaging region Dn of the imaging units U1 and Un located in the most peripheral part are smaller than the imaging region Dc of the imaging unit Uc located in the center part, and hence have a smaller number of pixels.

The imaging unit U1 acquires the image of the part of a photographic object region A1. That is, in the imaging unit U1, the lens element L1 forms in the imaging region D1 an optical image of the photographic object region A1. Similarly, the imaging unit Uc acquires the image of the part of a photographic object region Ac, while the imaging unit Un acquires the image of the part of a photographic object region An. At that time, the photographic object region A1 of the imaging unit U1 completely overlaps with the photographic object region A2 of the adjacent imaging unit U2, while the photographic object region An of the imaging unit Un completely overlaps with the photographic object region An-1 of the adjacent imaging unit Un-1. Thus, in the imaging device 200, the image signals outputted from the imaging unit U1 and the imaging unit Un can entirely be used for improving the resolution when a composite image is reconstructed.

Further, the imaging unit U1 and the imaging unit Un output image signals of the photographic object with resolutions different from that of the imaging unit Uc in the center part. Thus, even when the shooting distance is changed, the resolution of the composite image is not determined uniquely. Accordingly, even when the shooting distance is changed to a large extent, the change in the resolution is alleviated.

As described above, since the imaging device 200 includes imaging units having diverse imaging region areas, even when the shooting distance is changed, the resolution does not uniformly vary. Further, in the imaging device 200, the areas of the imaging regions of imaging units located in the most peripheral part are smaller than the areas of the imaging regions of imaging units located in the center part. Thus, the area of each overlapping part of the optical images of the photographic object can be increased, so that the resolution of the output composite image can be improved.

Further, in the imaging device 200, the imaging units have a lens element provided with an optical axis in agreement with the axis passing through the center of the corresponding imaging region and provided with an axial symmetric lens face having the shape of a circle approximately inscribing the rectangular imaging region. This simplifies the manufacture of the lens array as well as the assembling and adjustment of the lens array with the partition member or the image sensor.

Here, the imaging device 200 has been described for an exemplary case that the imaging regions of imaging units located in the most peripheral part are smaller than the imaging regions of imaging units located in the center part. However, the present invention is not limited to this. The areas of the imaging regions may be reduced sequentially in order from the center part to the most peripheral part. Further, the number of lens elements of the imaging device 200 is arbitrary. Thus, obviously, the image sensor in the center part may be divided into a desired number of imaging regions, and then the lens elements may be arranged in correspondence to each imaging region.

Embodiment 3

Figure 7:
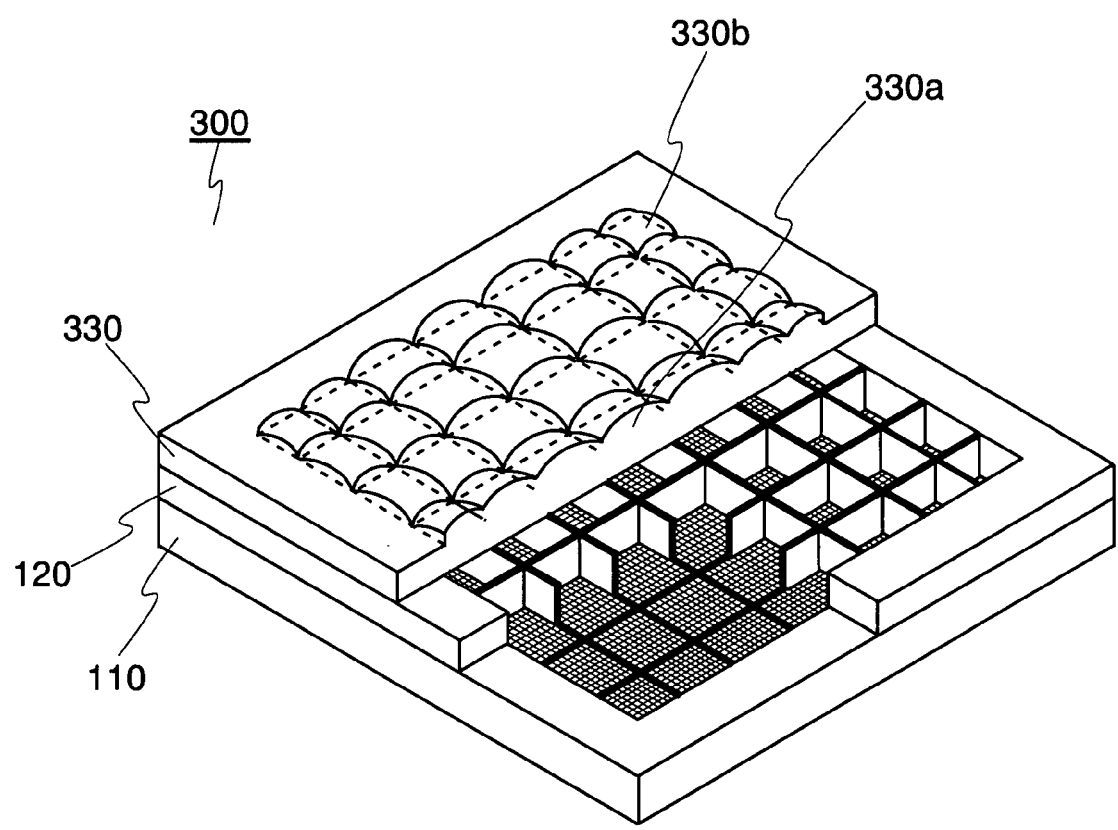
FIG. 7 is a part-removed perspective view showing a configuration of an imaging device according to Embodiment 3.
Figure 8:
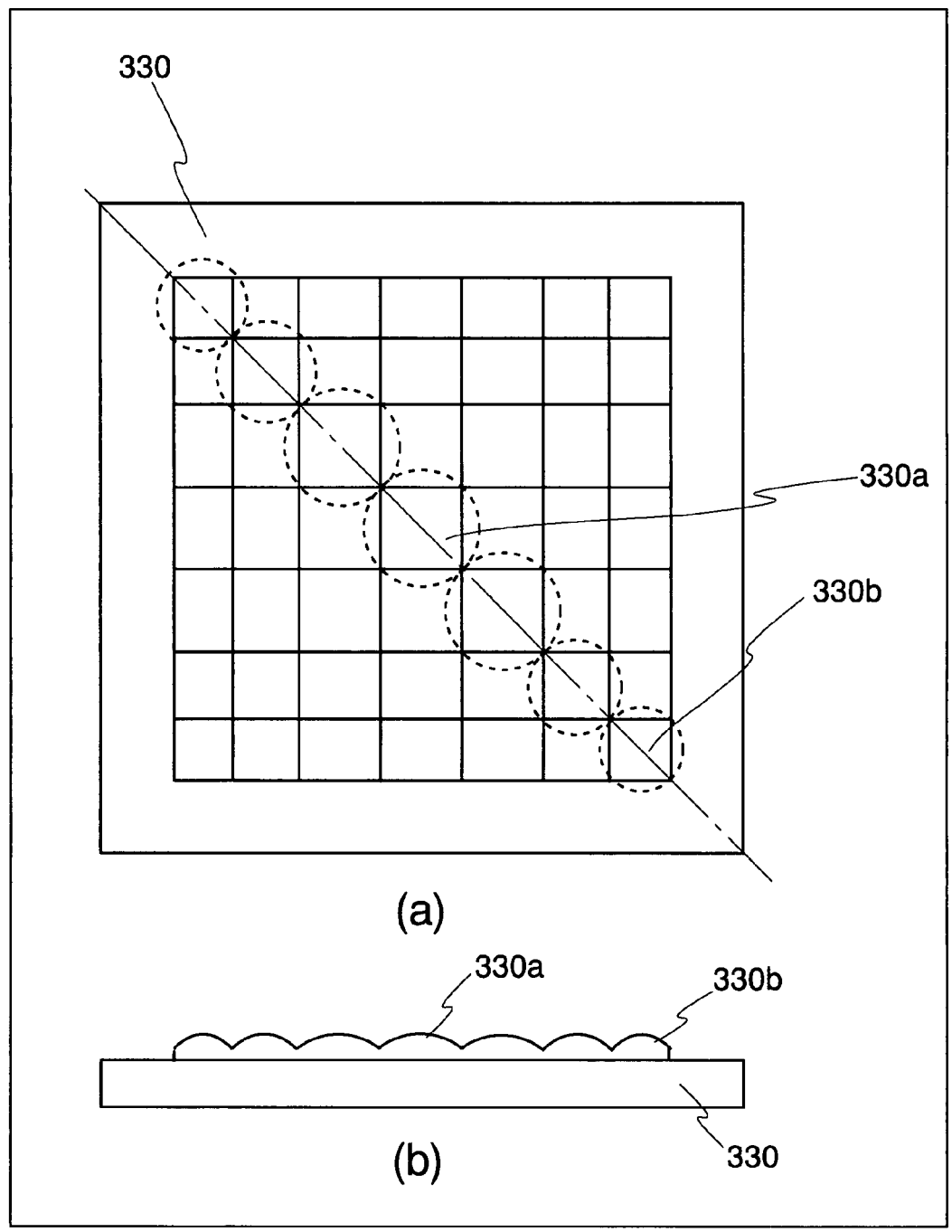
FIG. 8 is a schematic diagram showing a lens array of an imaging device according to Embodiment 3.

FIG. 7 is a part-removed perspective view showing a configuration of an imaging device according to Embodiment 3. Further, FIG. 8 is a schematic diagram showing a lens array of an imaging device according to Embodiment 3. FIG. 8(a) is a plan view of the lens array, while FIG. 8(b) is a side view of the lens array. The imaging device 300 according to Embodiment 3 has the same basic configuration as the imaging device 100 according to Embodiment 1. Thus, hereinafter, parts having a new feature depending on a difference part are solely described.

In the imaging device 300, the image sensor 110 and the partition member 120 have the same structures as those of the imaging device 100. Thus, the imaging device 300 is constructed such that the areas of the imaging regions of imaging units located in the periphery part distant from the center part of the image sensor should be smaller than the areas of the imaging regions of imaging units located in the center part of the image sensor. Specifically, as for the imaging units arranged on the diagonal line of the image sensor, the square imaging region of the imaging unit located in the most peripheral part is smaller than the square imaging region of the imaging unit located at a position deviated from the most peripheral part to the center side by one row. The square imaging region of the imaging unit located at a position deviated from the most peripheral part to the center side by one row is smaller than the square imaging region of the imaging unit located in the center part. The other imaging units located in the most peripheral part have imaging regions of a rectangle that has a side length equal to the side length (the length of one side of the square) of the imaging region of the imaging unit located at a corner of the most peripheral part. The other imaging units located at positions deviated from the most peripheral part to the center side by one row are similar.

The lens array 330 includes rectangular lens elements 330a, 330b and the like formed in correspondence to the shape of the imaging region. Here, each of the lens elements 330a, 330b and the like contained in the lens array 330 is a refractive type lens element that has an axial symmetric curved surface (typically, a spherical surface) convex to the photographic object side and that has overall positive optical power. All these lens elements have the shape of the same rectangle as the imaging region obtained by cutting off in four planes parallel to the symmetry axis in accordance with the corresponding imaging region.

In FIG. 8, the lens elements 330a, 330b and the like have a shape that is provided with an optical axis in agreement with the axis passing through the center of the corresponding imaging region and that is obtained by cutting off a part of an axial symmetric lens face having the shape of a circle larger than the rectangular imaging region. Each circle indicated by a dashed line in FIG. 8(a) shows the virtual shape of a circumscribed circle obtained when the lens face of a lens element arranged on the diagonal line of the lens array 330 is not cut off. For example, the lens element 330a arranged in the center part has a shape obtained by cutting off a refractive type lens having a lens diameter indicated by a dashed line, in accordance with the imaging region. Similarly, the lens element 330b located at a corner of the most peripheral part has a shape obtained by cutting off a refractive type lens having a lens diameter indicated by a dashed line, in accordance with the imaging region.

Since the imaging device 300 includes imaging units having diverse imaging region areas, even when the shooting distance is changed, the resolution does not uniformly vary. Further, in the imaging device 300, the areas of the imaging regions of imaging units located in the most peripheral part are smaller than the areas of the imaging regions of imaging units located in the center part. Thus, the area of each overlapping part of the optical images of the photographic object can be increased, so that the resolution of the output composite image can be improved.

Further, in the imaging device 300, the imaging units include a lens element having the shape of the same rectangle as the imaging region obtained by cutting off in four planes parallel to the symmetry axis in accordance with the corresponding imaging region. Thus, the entire light incident on the lens array can contribute to the imaging, and hence the utilization efficiency of the light beam is improved.

Further, in the imaging device 300, the imaging units have a lens element provided with an optical axis in agreement with the axis passing through the center of the corresponding imaging region. This simplifies the manufacture of the lens array as well as the assembling and adjustment of the lens array with the partition member or the image sensor.

Here, the imaging device 300 has been described for an exemplary case that the imaging regions of the two rows of imaging units consisting of the imaging units located in the most peripheral part and the imaging units located at positions deviated from the most peripheral part to the center side by one row are smaller than the imaging regions of imaging units located in the center part. However, the present invention is not limited to this. The areas of the imaging regions may be reduced sequentially in order from the center part to the most peripheral part. Further, the number of lens elements of the imaging device 300 is arbitrary. Thus, obviously, the image sensor in the center part may be divided into a desired number of imaging regions, and then the lens elements may be arranged in correspondence to each imaging region.

Embodiment 4

Figure 9:
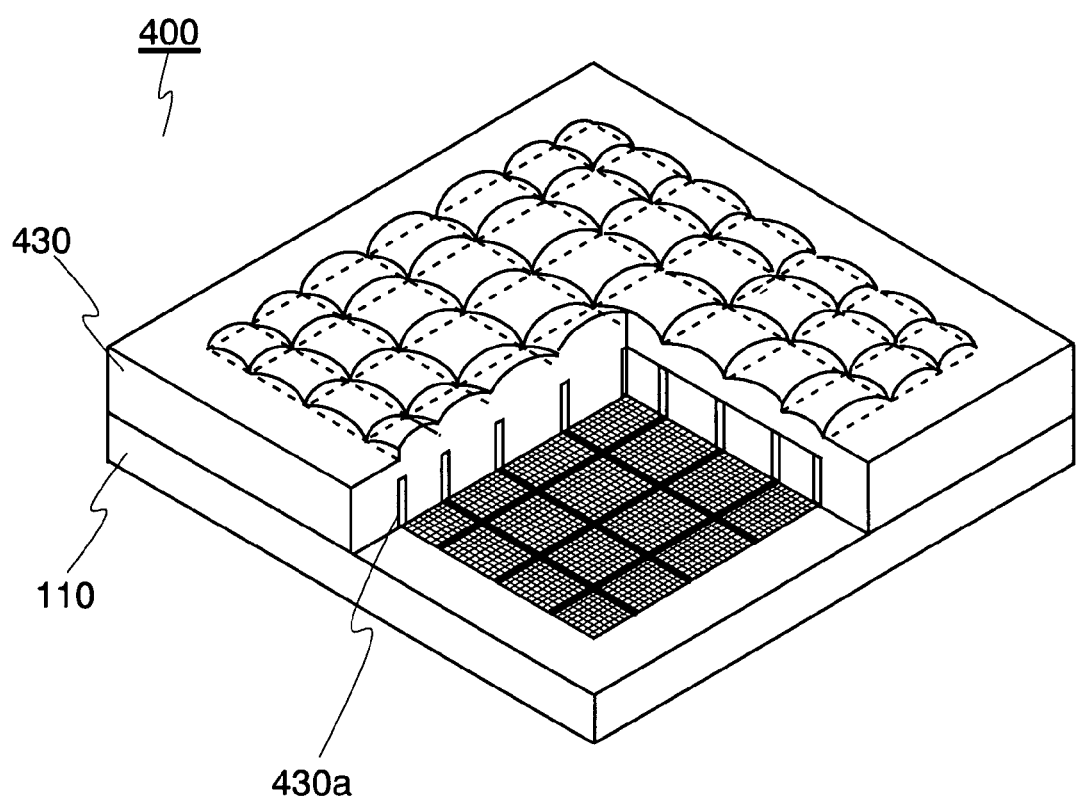
FIG. 9 is a part-removed perspective view showing a configuration of an imaging device according to Embodiment 4.
Figure 10:
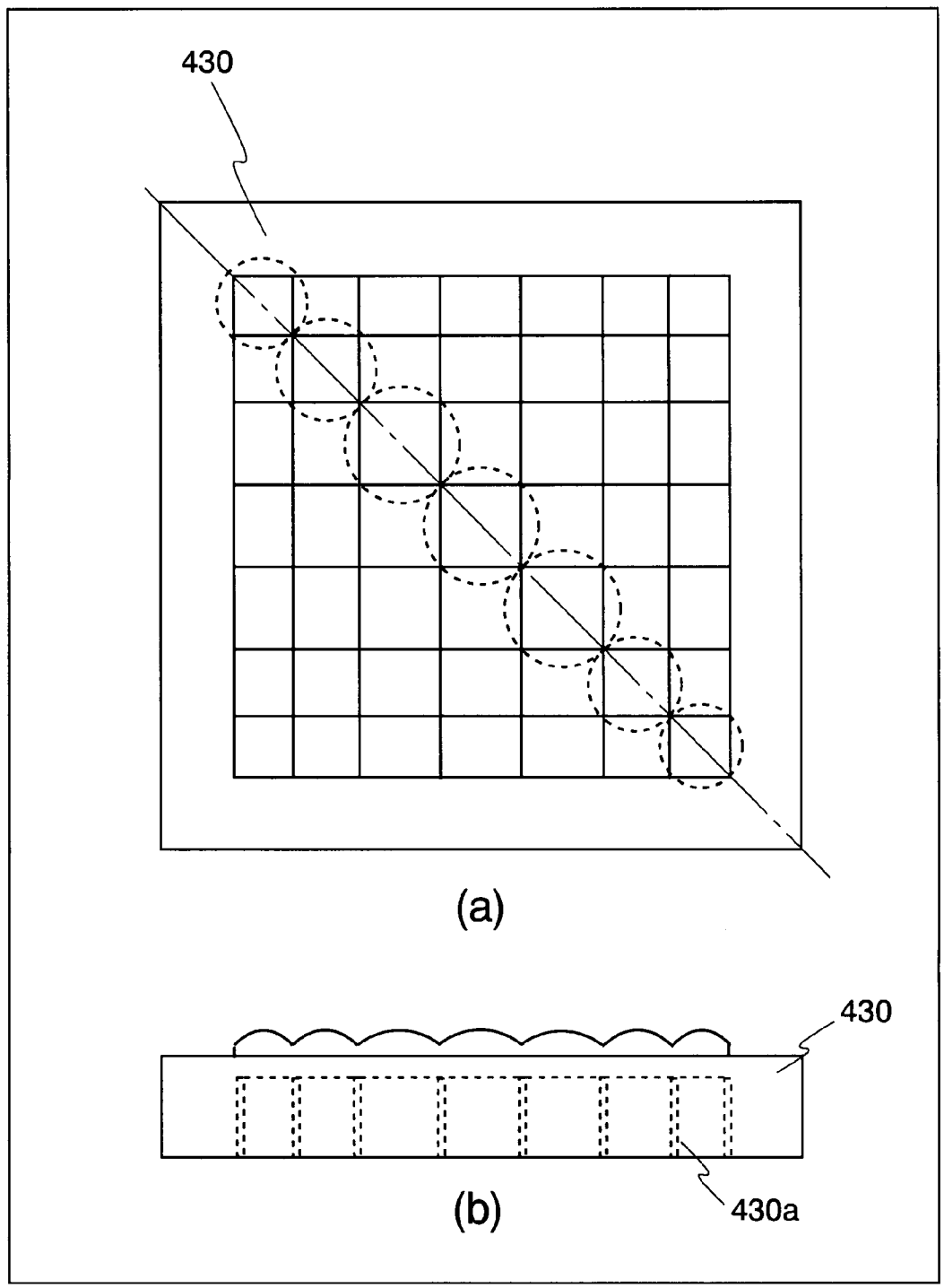
FIG. 10 is a schematic diagram showing a lens array of an imaging device according to Embodiment 4.

FIG. 9 is a part-removed perspective view showing a configuration of an imaging device according to Embodiment 4. Further, FIG. 10 is a schematic diagram showing a lens array of an imaging device according to Embodiment 4. FIG. 10(a) is a plan view of the lens array, while FIG. 10(b) is a side view of the lens array. The imaging device 400 according to Embodiment 4 has the same basic configuration as the imaging device 300 according to Embodiment 3. Thus, hereinafter, parts having a new feature depending on a difference part are solely described.

The imaging device 400 is characterized by the point that the partition means is not composed of a partition member having a partition section formed separately from the lens element constituting the lens array, but composed of a groove section formed in a manner integrated with the lens element constituting the lens array. The imaging device 400 includes an image sensor 110 and a lens array 430. The image sensor 110 has the same structure as the image sensor employed in the imaging device 100.

The lens array 430 has the same lens face configuration as the lens array 330 employed in the imaging device 300. That is, the lens array 430 has a shape that rectangular lens elements of the same shape as the corresponding imaging regions are arranged in parallel. On the image side of the lens array 430, a grid-shaped groove section 430a is formed. The groove section 430a is formed in the same shape as the partition section 120a of the partition member 120 described in the imaging device 100. The partition section of the groove section 430a is formed in a roughened surface in order to prevent incident stray light from being reflected regularly so as to reach other imaging regions.

In the imaging device 400, similarly to the partition section 120a of the imaging device 100, the groove section 430a has functions that reflection of stray light incident on the partition section is suppressed and that incident light emitted from the lens elements other than the corresponding lens element is prevented from reaching other imaging regions. This avoids cross talk that could be generated between the imaging regions. Further, in the imaging device 400, the lens array 430 and the groove section 430a serving as the partition means can be formed in an integrated manner. Thus, in the assembling and adjustment of the imaging device, the necessity of alignment is avoided between the individual lens elements in the lens array and the groove section serving as the partition means. This permits easy and precise assembling of the imaging device. That is, in the imaging device 400, in addition to the operation effect described in the imaging device 300, an operation effect is obtained that assembling and adjustment are easy.

Here, the groove section 430a may be formed in an integrated manner at the time of injection molding of the lens array with resin, or alternatively may be formed by laser beam machining after injection molding of a thick lens array with resin.

Here, when the groove section 430a is filled with black resin, reflection of stray light is suppressed further, and hence this approach is preferable. Alternatively, light absorbing material may be applied to the partition section of the groove section 430a. Further, the partition section may be painted black.

Here, the lens array 430 of the imaging device 400 has the same lens face configuration as the lens array 330 of the imaging device 300. However, the present invention is not limited to this. A lens array having the lens face of the shape described in the imaging device 100 and the imaging device 200 may be employed. Alternatively, a lens array having a lens face of another shape may be employed. Further, the number of lens elements of the imaging device 400 is arbitrary. Thus, obviously, the image sensor in the center part may be divided into a desired number of imaging regions, and then the lens elements may be arranged in correspondence to each imaging region.

Embodiment 5

Figure 11:
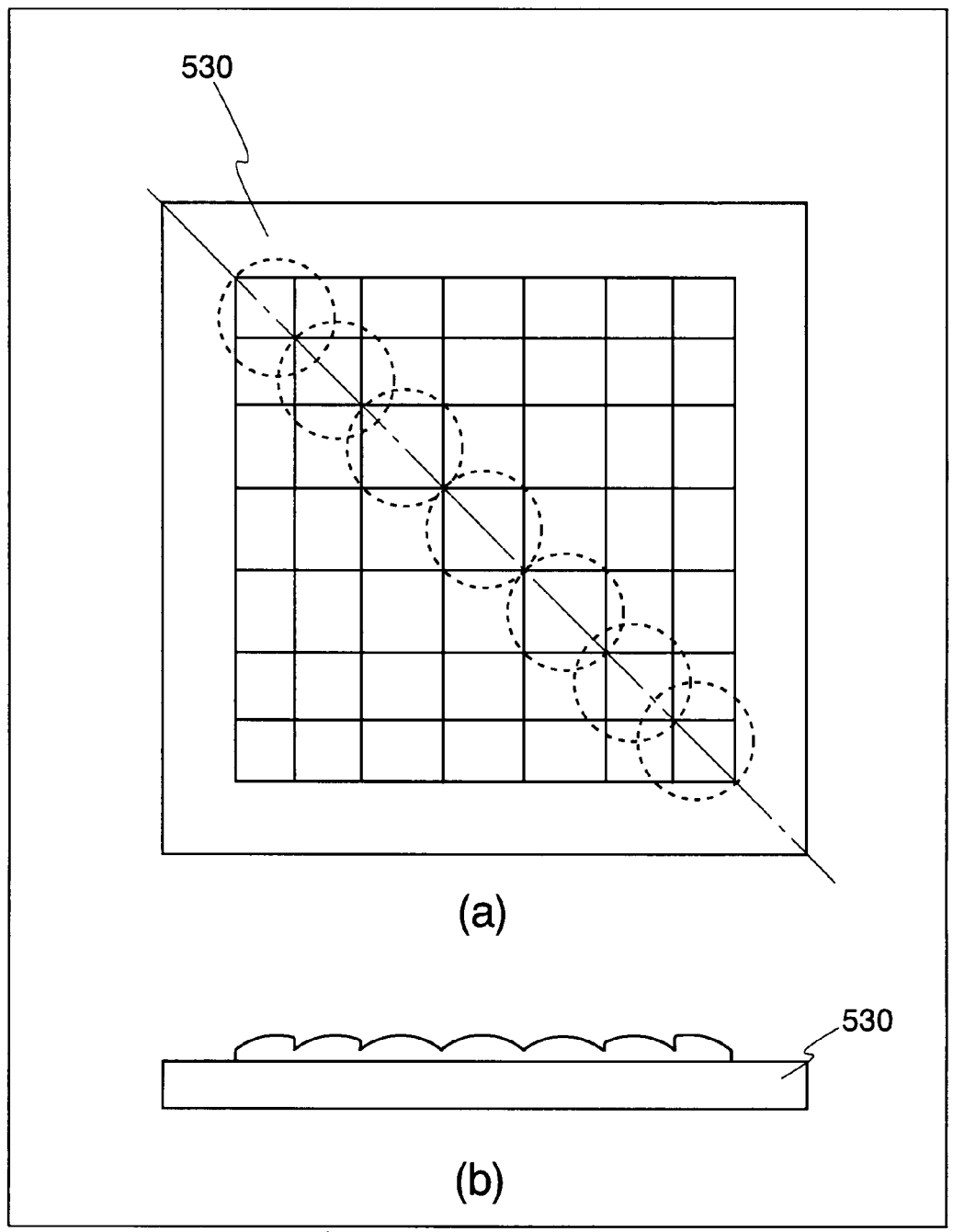
FIG. 11 is a schematic diagram showing a lens array of an imaging device according to Embodiment 5.

FIG. 11 is a schematic diagram showing a lens array of an imaging device according to Embodiment 5. FIG. 11(a) is a plan view of the lens array, while FIG. 11(b) is a side view of the lens array. The imaging device according to Embodiment 5 has the same basic configuration as the imaging device 300 according to Embodiment 3. Thus, hereinafter, parts having a new feature depending on a difference part are solely described.

The lens array 530 has a configuration approximately the same as that of the lens array 330. The lens array 530 and the lens array 330 are the same in the point that the lens elements contained therein have a shape obtained by cutting off a part of an axial symmetric lens face having the shape of a circle larger than the rectangular imaging region. Nevertheless, in each lens element contained in the lens array 330, the axis passing through the center of the corresponding imaging region agrees with the optical axis. In contrast, the lens elements arranged in the most peripheral part and arranged at a position deviated from the most peripheral part to the center side by one row among the lens elements contained in the lens array 530, are lens elements each provided with a symmetry axis decentered in parallel to the axis passing through the center of the corresponding imaging region.

Also when the lens array 530 is employed, an effect similar to that of Embodiment 1 is obtained. Here, the number of lens elements of the imaging device according to Embodiment 5 is arbitrary. Thus, obviously, the image sensor in the center part may be divided into a desired number of imaging regions, and then the lens elements may be arranged in correspondence to each imaging region.

Embodiment 6

Figure 12:
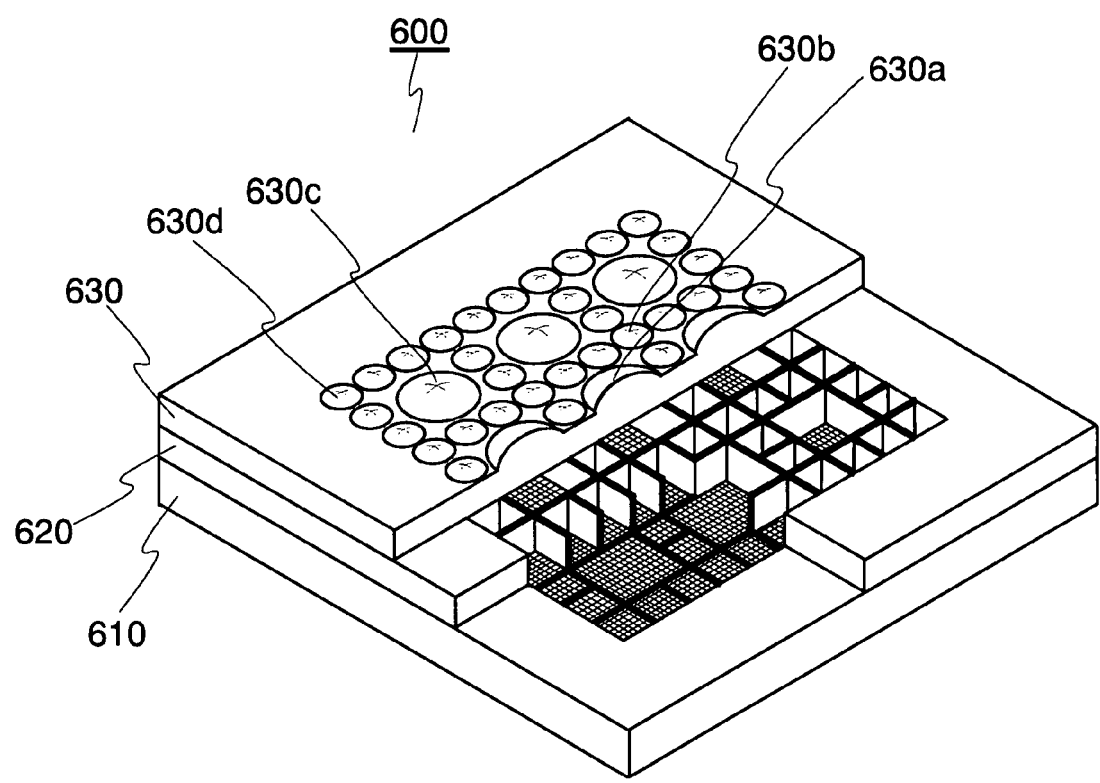
FIG. 12 is a part-removed perspective view showing a configuration of an imaging device according to Embodiment 6.
Figure 13:
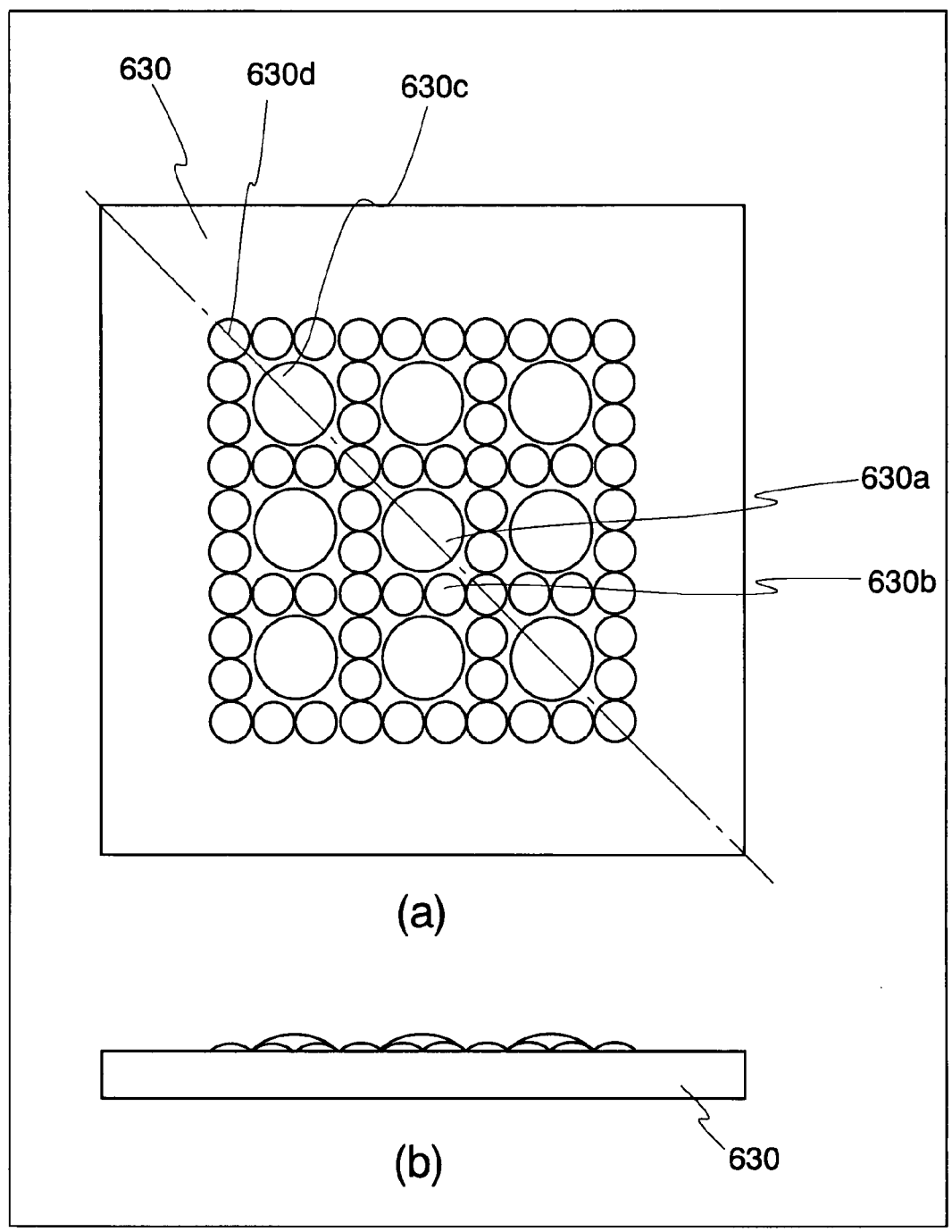
FIG. 13 is a schematic diagram showing a lens array of an imaging device according to Embodiment 6.
Figure 14:
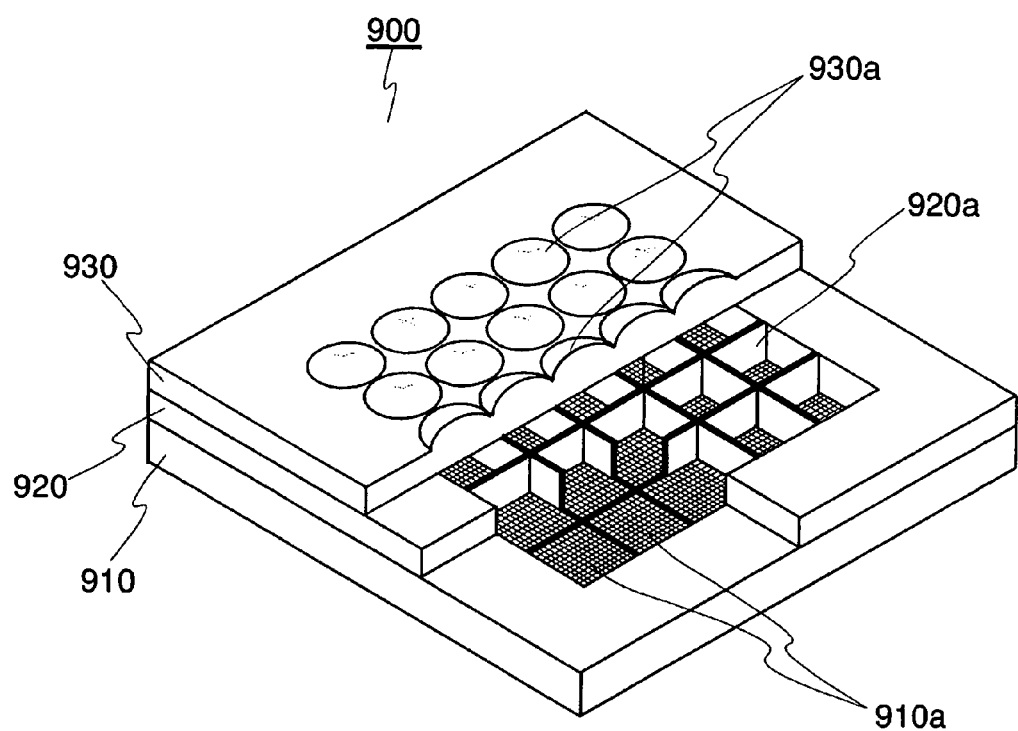
FIG. 14 is a part-removed perspective view showing an example of a configuration of a conventional imaging device.
Figure 15:
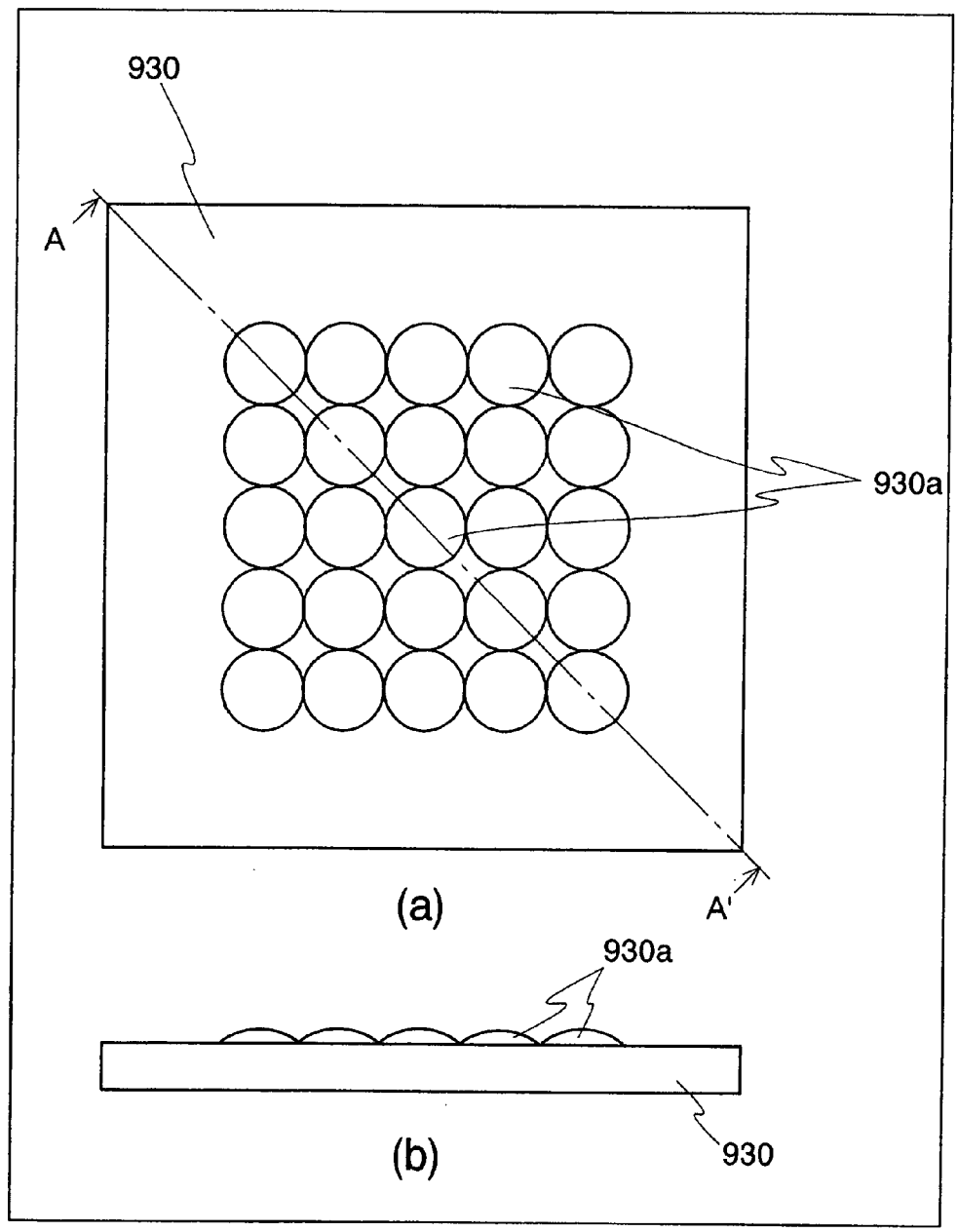
FIG. 15 is a schematic diagram of a lens array of a conventional imaging device.

FIG. 12 is a part-removed perspective view showing a configuration of an imaging device according to Embodiment 6. Further, FIG. 13 is a schematic diagram showing a lens array of an imaging device according to Embodiment 6. FIG. 13(a) is a plan view of the lens array, while FIG. 13(b) is a side view of the lens array. The imaging device 600 according to Embodiment 6 has the same basic configuration as the imaging device 100 according to Embodiment 1. Thus, hereinafter, parts having a new feature depending on a difference part are solely described.

The imaging device 600 includes an image sensor 610, a partition member 620 and a lens array 630. A feature of the imaging device 600 is that imaging units each having the imaging region of the same area as the area of the imaging region of an imaging unit located in the center part are arranged in the vicinity of the periphery part. That is, in the lens array 630, lens elements 630b of smaller diameter are arranged around the lens element 630a of larger diameter arranged in the center part. Further, a lens element 630c having the same diameter as the lens element 630a of larger diameter arranged in the center part is arranged in a part adjacent to the lens element 630b of smaller diameter. Furthermore, lens elements 630d having the same diameter as the lens elements 630b of smaller diameter are arranged around the lens element 630c of larger diameter.

Also when the lens array 630 is employed, an effect similar to that of Embodiment 1 is obtained. In particular, in the imaging device 600, the area occupied in the lens array 630 by the lens elements 630b, 630d and the like of smaller diameter becomes large. This provides a remarkable effect of alleviating the change in the resolution at the time of a change in the shooting distance.

Further, the number of lens elements of the imaging device 600 is arbitrary. Thus, obviously, the image sensor in the center part may be divided into a desired number of imaging regions, and then the lens elements may be arranged in correspondence to each imaging region.

Other Embodiments

The lens array employed in the imaging device according to each embodiment described above has a shape in which the same number of lens elements are arranged in the mutually perpendicular directions. However, the present invention is not limited to this. An image sensor having an aspect ratio of 4:3, 16:9 or the like may be employed so that the number of arranged lens elements may be changed in the mutually perpendicular directions.

Here, the lens array employed in each embodiment described above is composed exclusively of refractive type lens elements that deflect the incident light by refraction (that is, lens elements of a type in which deflection is achieved at the interface between media each having a distinct refractive index). However, the present invention is not limited to this. For example, the lens array may be constructed from diffractive type lens elements that deflect the incident light by diffraction; refractive-diffractive hybrid type lens elements that deflect the incident light by a combination of diffraction and refraction; or gradient index type lens elements that deflect the incident light by means of distribution of refractive index in the medium.

Further, the lens array employed in the imaging device according to each embodiment described above is constructed from planer-convex lens elements that have a convex surface provided with optical power on the photographic object side and that have a plane surface on the image side. However, the present invention is not limited to this. For example, the lens array may be constructed from bi-convex lens elements having convex surfaces both on the photographic object side and on the image side, or alternatively from positive meniscus lens elements in which any one of the photographic object side and the image side is convex and the other side is concave. Further, the lens array may be constructed from planer-convex lens elements that have a convex surface provided with optical power on the image side and that have a plane surface on the photographic object side.

Further, in each embodiment described above, the imaging optical system of each imaging unit is constructed solely from a lens element constituting the lens array. However, the present invention is not limited to this. For example, this lens array and another lens array may be combined so as to constitute an imaging optical system. Alternatively, this lens array and another lens element may be combined so as to constitute an imaging optical system.

INDUSTRIAL APPLICABILITY

The imaging device of the present invention is applicable not only to a digital still camera and a digital video camera but also to all types of cameras such as: a camera mounted on a mobile computing device including a notebook personal computer and a portable telephone terminal device; a vehicle-mounted camera; and a surveillance camera. Further, the imaging device of the present invention is suitable also for an imaging device for input in a security device using biometrics information, such as a fingerprint authentication device or an iris authentication device.

The invention claimed is:

1. An imaging device for imaging an object, comprising:
a lens array comprising a plurality of lens elements arranged in a matrix and having optical power in at least one surface; and
an image sensor comprising a plurality of imaging regions arranged in a matrix, each of the imaging regions having a plurality of photoelectric conversion sections and receiving an optical image of the object formed by corresponding one of the lens elements so that the optical image is converted into an electric image signal, wherein:
each lens element and the imaging region corresponding to the lens element constitute an imaging unit,
the imaging units include a first imaging unit and a second imaging unit,
a first region of the object of which image is received by the first imaging unit is fully included in a second region of the object of which image is received by the second imaging unit, and
the second region of the object is larger than the first region of the object.

2. The imaging device as claimed in claim 1, wherein the areas of the imaging regions of imaging units located in a most peripheral part of the image sensor are smaller than the areas of the imaging regions of imaging units located in a center part of the image sensor.

3. The imaging device as claimed in claim 2, wherein imaging units located in the most peripheral part of the image sensor have a lens element provided with a symmetry axis decentered in parallel to an axis passing through the center of the corresponding imaging region.

4. The imaging device as claimed in claim 2, wherein imaging units located in the most peripheral part of the image sensor have a lens element provided with a symmetry axis in agreement with an axis passing through the center of the corresponding imaging region.

5. The imaging device as claimed in claim 1, wherein the imaging units have a lens element having a shape obtained by cutting off a part of an axial symmetric lens element in a plane parallel to the symmetry axis.

6. The imaging device as claimed in claim 1, wherein the imaging units have an axial symmetric lens element provided with an axial symmetric lens face having a shape of a circle approximately inscribing a rectangular imaging region.

7. The imaging device as claimed in claim 1, further comprising a partition means for partitioning a space between the lens array and the image sensor for each of the imaging units.

8. The imaging device as claimed in claim 7, wherein the partition means is a partition member that is arranged separately from the lens element and that has a grid-shaped partition section formed such as to surround each imaging region in correspondence to a rectangular imaging region.

9. The imaging device as claimed in claim 7, wherein the partition means is a grid-shaped groove section that is formed in a manner integrated with the lens element and that is formed such as to surround each imaging region in correspondence to a rectangular imaging region.

10. A lens array used in the imaging device as claimed in claim 1.

11. The imaging device of claim 1, wherein the first imaging unit is located in a most peripheral part of the image sensor and the second imaging unit is located adjacent to the first imaging unit.

* * * * *